(12) United States Patent
Jan et al.

(10) Patent No.: US 11,075,286 B2
(45) Date of Patent: Jul. 27, 2021

(54) HYBRID FINFET STRUCTURE WITH BULK SOURCE/DRAIN REGIONS

(71) Applicant: Intel Corporation, Santa Clara, CA (US)

(72) Inventors: Chia-Hong Jan, Portland, OR (US); Walid M. Hafez, Portland, OR (US); Neville L. Dias, Hillsboro, OR (US); Rahul Ramaswamy, Portland, OR (US); Hsu-Yu Chang, Hillsboro, OR (US); Roman W. Olac-Vaw, Hillsboro, OR (US); Chen-Guan Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/344,003

(22) PCT Filed: Dec. 12, 2016

(86) PCT No.: PCT/US2016/066224
§ 371 (c)(1),
(2) Date: Apr. 22, 2019

(87) PCT Pub. No.: WO2018/111223
PCT Pub. Date: Jun. 21, 2018

(65) Prior Publication Data
US 2019/0237564 A1    Aug. 1, 2019

(51) Int. Cl.
*H01L 29/66*    (2006.01)
*H01L 29/78*    (2006.01)
(Continued)

(52) U.S. Cl.
CPC .... *H01L 29/66795* (2013.01); *H01L 29/0847* (2013.01); *H01L 29/1033* (2013.01);
(Continued)

(58) Field of Classification Search
CPC ............... H01L 29/66795; H01L 29/1033
See application file for complete search history.

(56) References Cited

U.S. PATENT DOCUMENTS

| | | |
|---|---|---|
| 2007/0190732 A1 | 8/2007 | Lee et al. |
| 2007/0284661 A1 | 12/2007 | Yamada et al. |
| (Continued) | | |

OTHER PUBLICATIONS

International Search Report and Written Opinion for International Patent Application No. PCT/US2016/066224 dated Aug. 29, 2017, 12 pgs.

(Continued)

*Primary Examiner* — Farun Lu
(74) *Attorney, Agent, or Firm* — Schwabe, Williamson & Wyatt, P.C.

(57) ABSTRACT

A transistor including a source and a drain each formed in a substrate; a channel disposed in the substrate between the source and drain, wherein the channel includes opposing sidewalls with a distance between the opposing sidewalls defining a width dimension of the channel and wherein the opposing sidewalls extend a distance below a surface of the substrate; and a gate electrode on the channel. A method of forming a transistor including forming a source and a drain in an area of a substrate; forming a source contact on the source and a drain contact on the drain; after forming the source contact and the drain contact, forming a channel in the substrate in an area between the source and drain, the channel including a body having opposing sidewalls separated by a length dimension; and forming a gate contact on the channel.

21 Claims, 7 Drawing Sheets

(51) Int. Cl.
*H01L 29/739* (2006.01)
*H01L 29/08* (2006.01)
*H01L 29/10* (2006.01)

(52) U.S. Cl.
CPC ........ *H01L 29/66* (2013.01); *H01L 29/66356* (2013.01); *H01L 29/66818* (2013.01); *H01L 29/7391* (2013.01); *H01L 29/785* (2013.01); *H01L 29/7851* (2013.01)

(56) References Cited

U.S. PATENT DOCUMENTS

| | | | |
|---|---|---|---|
| 2010/0261328 A1* | 10/2010 | Kujirai | H01L 29/7851 438/296 |
| 2013/0015534 A1* | 1/2013 | Cheng | H01L 21/845 257/401 |
| 2013/0161642 A1 | 6/2013 | Zhu et al. | |
| 2013/0285125 A1* | 10/2013 | Chen | H01L 24/13 257/288 |
| 2014/0357040 A1 | 12/2014 | Loubet et al. | |
| 2015/0041854 A1* | 2/2015 | Wang | H01L 29/66795 257/190 |
| 2015/0279972 A1* | 10/2015 | Xie | H01L 29/785 438/283 |
| 2016/0056157 A1 | 2/2016 | Ching et al. | |
| 2016/0190243 A1* | 6/2016 | Lee | H01L 29/0847 257/401 |
| 2018/0240874 A1* | 8/2018 | Weber | H01L 29/66522 |

OTHER PUBLICATIONS

International Preliminary Report on Patentability for International Patent Application No. PCT/US2016/066224, dated Jun. 27, 2019, 9 pages.

\* cited by examiner

HYBRID FINFET STRUCTURE WITH BULK SOURCE/DRAIN REGIONS

CROSS-REFERENCE TO RELATED APPLICATION

This patent application is a U.S. National Phase Application under 35 U.S.C. § 371 of International Application No. PCT/US2016/066224, filed Dec. 12, 2016, entitled "HYBRID FINFET STRUCTURE WITH BULK SOURCE/DRAIN REGIONS," which designates the United States of America, the entire disclosure of which is hereby incorporated by reference in its entirety and for all purposes.

BACKGROUND

Field

Integrated circuit devices.

Description of Related Art

In the pursuit of increased transistor scaling, gate control over subthreshold leakage becomes critical. To address this issue, transistor scaling is promoted. Transistor scaling results in reduced dimensionality of the active transistor structure to, for example, three-dimensional configurations (e.g., FINFETs) and nanowires. While these structures generally have excellent subthreshold characteristics, on-state leakage tends to be limited by source/drain contact resistance due to reduced contact area at the source/drain regions.

DETAILED DESCRIPTION

A transistor structure is described that utilizes a bulk source/drain configuration and a fin as a channel to combine benefits of improved channel control and enhanced source/drain contact resistance.

Figure 1:
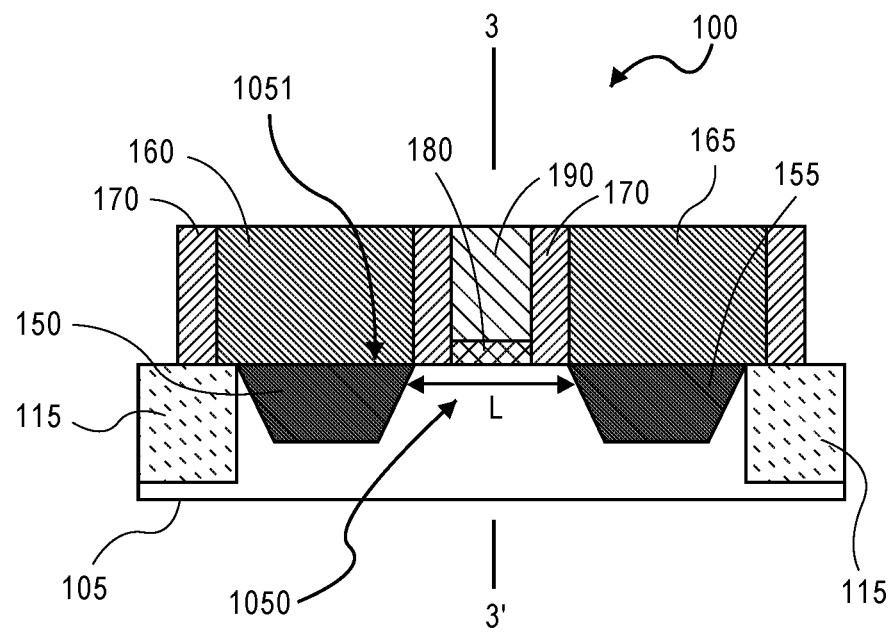
FIG. 1 shows a cross-sectional side view of an embodiment of a field effect transistor (FET).
Figure 2:
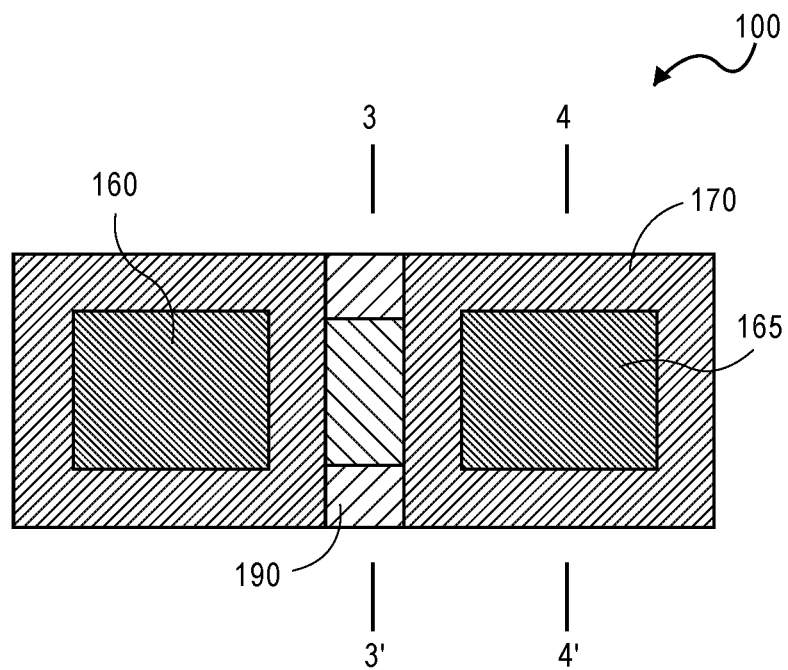
FIG. 2 shows a top view of the structure of FIG. 1.
Figure 3:
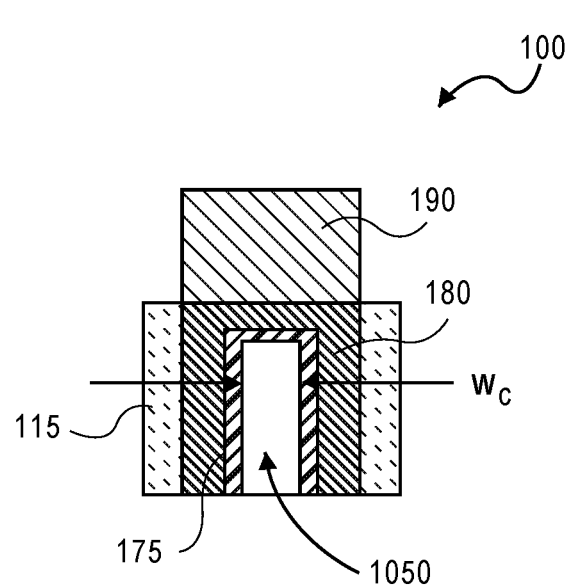
FIG. 3 shows the structure of FIG. 1 and FIG. 2 through line 3-3' of FIG. 2.
Figure 4:
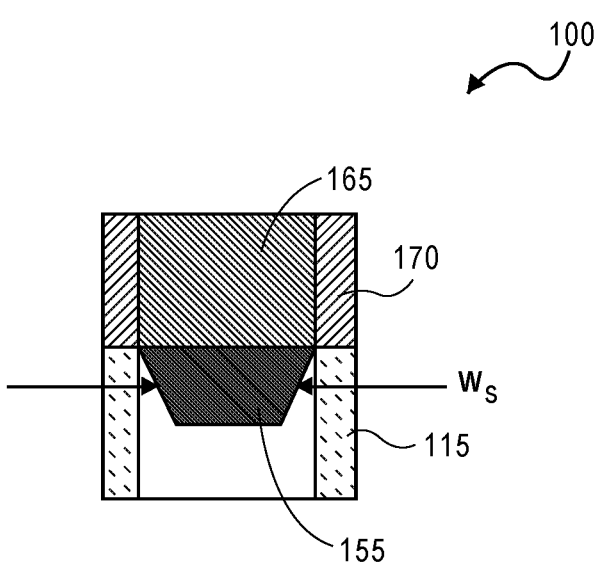
FIG. 4 shows the structure of FIG. 1 and FIG. 2 through line 4-4' of FIG. 2.

FIG. 1 shows a cross-sectional side view of an embodiment of a field effect transistor (FET) such as a metal oxide semiconductor field effect transistor (MOSFET) device, a tunneling field effect transistor (TFET) device or other FET device. FIG. 2 shows a top view of the structure of FIG. 1. FIG. 3 shows the structure of FIG. 1 and FIG. 2 through line 3-3' of FIG. 2 and FIG. 4 shows the structure through line 4-4' of FIG. 2.

Referring to FIGS. 1-4, structure 100 includes substrate 105 that is, for example, a single crystal semiconductor substrate such as a single crystal silicon substrate or a silicon on insulator (SOI) substrate. A transistor area of substrate 105 is defined by trench isolation. Representatively, a trench is formed in substrate 105 around an area for a transistor device (e.g., a single transistor device). The trench is filled with dielectric material such as silicon dioxide to define trench isolation 115. The device area within trench isolation 115 may be referred to as the bulk referring to an area in the substrate that is to be modified to form a transistor device. As shown in FIG. 1, formed in a surface of substrate 105 (in the bulk) is drain 150 and source 155. In one embodiment, drain 150 and source 155 are heavily doped semiconductor materials for a particular conductivity of the device or a MOSFET. Representatively, drain 150 and source 155 are a semiconductor material such as silicon or a group III-V compound semiconductor (e.g., indium gallium arsenide (InGaAs) doped, for example, with phosphorous or arsenic for n-type device or silicon, germanium or silicon germanium doped with boron for a p-type device.

Disposed between drain 150 and source 155 in substrate 105 is fin or body 1050, representatively of the semiconductor material of substrate 105 or a different semiconductor material. As illustrated in FIG. 3, fin 1050 is patterned (e.g., etched or cut) from substrate 105 or grown on substrate 105 between drain 150 and source 155. Thus, where fin 1050 is patterned from substrate 105, fin 1050 is defined, for example, in the substrate while drain 150 and source 155 are formed in surface 1051 of substrate 105 (a superior surface as shown) such as by removing substrate material starting from surface 1051 and extending a depth into the substrate and replacing the removed material with a desired drain and source material. Drain 150 and source 155 are not formed in the fin or body. Accordingly, as shown in FIG. 3, fin 1050 is defined by a width dimension, $W_c$, defined by opposing sidewalls that extend a distance below surface 1051 of substrate 105. Fin 1050 forms the channel of the transistor device. A representative fin width, $W_c$, is on the order of 10-100 nm. As shown in FIG. 4, source 155 has an average width, $W_s$, on the order of 20-200 nm which is greater than the width of fin 1050 ($W_s > W_c$).

As shown in FIG. 3, disposed on fin 1050 (on opposing sidewalls and a superior surface of fin 1050 as viewed) is a gate stack including gate dielectric 175 of, for example, silicon dioxide or a dielectric material having a dielectric constant greater than silicon dioxide (a high K material). Disposed on gate dielectric 175 is gate electrode 180 of, for example, a metal material (e.g., tantalum, titanium), a metal nitride (e.g., tantalum nitride, titanium nitride), an alloy or a silicide. With reference to FIGS. 1 and 2, disposed on drain 150, in this embodiment, is contact 160 and on source 155 is contact 165. Disposed on gate electrode 180 is contact 190. Such contacts are, for example, a metal material such as tungsten. Sidewalls of each of the contacts are insulated with dielectric material 170 of, for example, silicon nitride.

Figure 18:
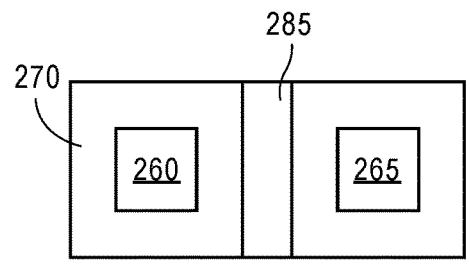
FIG. 18 shows a top view of the structure of FIG. 17.
Figure 19:
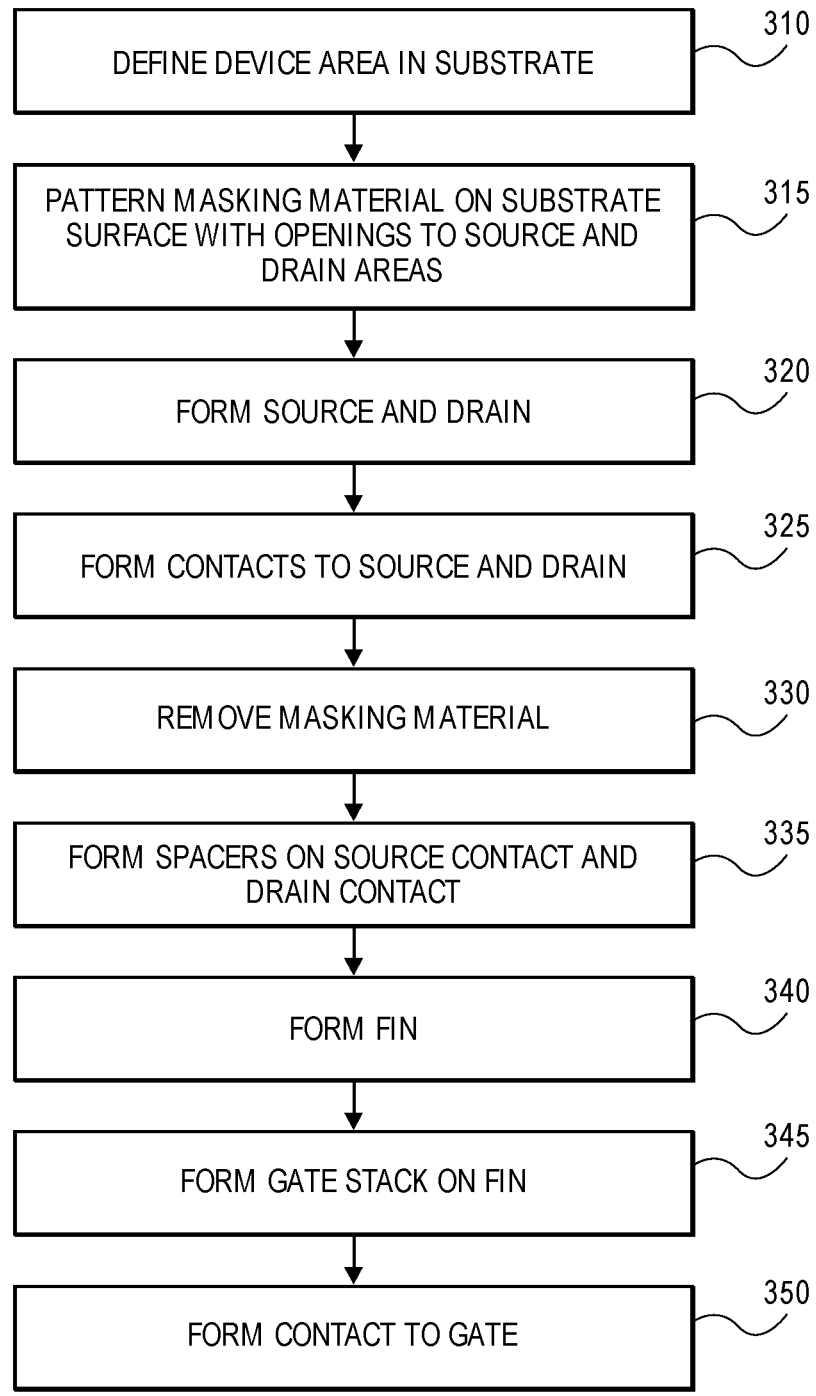
FIG. 19 presents a flow chart of the method described with reference to FIGS. 5-18.

FIGS. 5-18 describe one process for forming an integrated circuit device similar to that illustrated in FIGS. 1-4. FIGS. 5-18 thus describe one embodiment of forming a transistor device including forming a source and drain in the bulk substrate and a channel in a body or fin. Previous transistor fabrication techniques have relied on first patterning a gate and using the gate to create self-aligned source/drain region. Such method requires patterning of the active structure (the fin or channel) prior to source and drain formation. In the process described in FIGS. 5-18, the source and drain are first patterned on a bulk substrate and use to create a self-aligned gate. The active channel structure is then patterned independently to provide improved short channel control. FIG. 19 presents a flow chart of the method described with reference to FIGS. 5-18.

Figure 5:
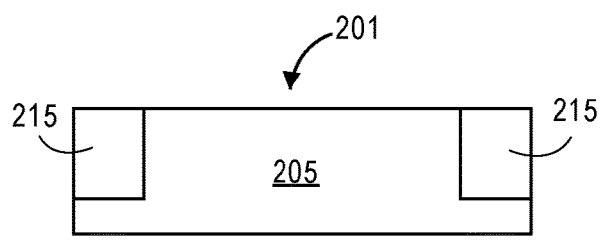
FIG. 5 shows a cross-sectional side view of a portion substrate having a trench isolation region defining a device area.
Figure 6:
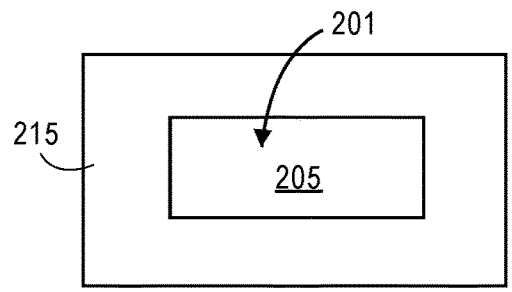
FIG. 6 is a top view of the structure of FIG. 5.

Referring to FIG. 5, and with reference to the flow chart of FIG. 19, the process begins by defining a device area in a substrate (block 310, FIG. 19). FIG. 5 shows a cross-sectional side view of substrate 205 that representatively is a portion of a larger substrate such as a wafer. FIG. 6 shows a top view of the structure of FIG. 5. In one embodiment, substrate 205 is a semiconductor material such as single crystal silicon that may be a unitary substrate or, in another embodiment, a silicon on insulator (SOI) structure. FIG. 5 shows substrate 205 including trench isolation layer 215 surrounding an area of the substrate, to define device area 201 or bulk where a transistor device will be formed. Trench isolation layer 215 is, for example, a dielectric material such as silicon dioxide. The trench isolation may be formed by first masking a surface of substrate 205 in an area with a mask having an opening for the trench isolation area. Once the mask is patterned, substrate 205 may be etched to remove material on unprotective areas. A substrate of silicon may be etched with a wet or dry etch. Representatively, a suitable etchant is chlorine or fluorine plasma base etch chemistry. The etch defines a trench around a device area having a depth that is greater than a depth targeted for the transistor device of the substrate. Once a trench is formed, the trench is filled with dielectric material of, for example, silicon dioxide by, for example, a chemical vapor deposition (CVD) process. FIG. 6 shows device area 201 having a representatively rectangular shape selected, in one embodiment, of a size to accommodate a single transistor device. Other shapes may also be used.

Figure 7:
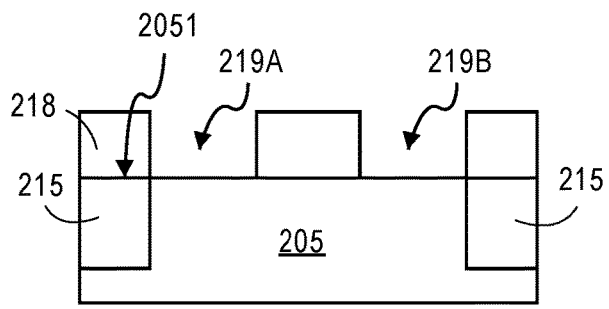
FIG. 7 shows the structure of FIG. 5 following the patterning of a mask material to define areas for diffusion or junction regions of a transistor device.
Figure 8:
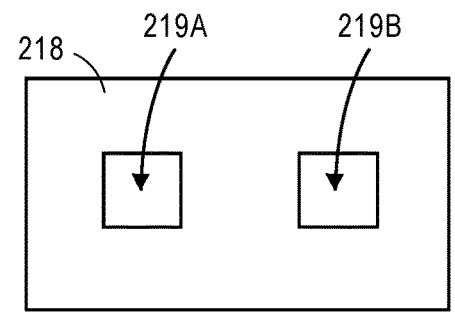
FIG. 8 is a top view of the structure of FIG. 7.

FIG. 7 shows the structure of FIG. 5 following the patterning of a mask material to define areas for diffusion or junction regions of a transistor device (block 315, FIG. 19). FIG. 8 is a top view of the structure of FIG. 7. With reference to FIG. 7 and FIG. 8, the structure show mask material 218 of, for example, a photoresist material deposited on surface 2051 (a superior surface) of substrate 205. Masking material 218 is patterned to have openings 219A and 219B for diffusion or junction regions (drain and source) of a transistor device.

Figure 9:
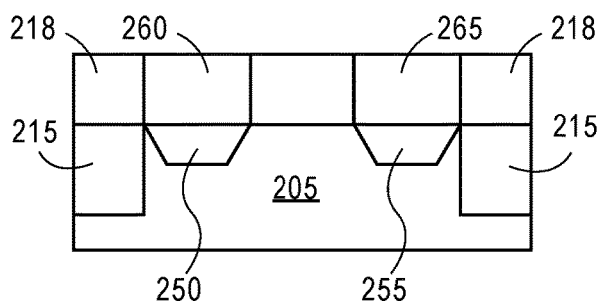
FIG. 9 shows the structure of FIG. 7 following the formation of a drain and a source of a transistor device and forming of contacts to each of the source and the drain.
Figure 10:
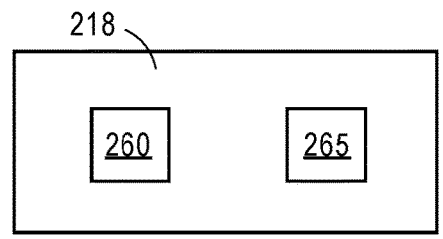
FIG. 10 is a top view of the structure of FIG. 9.

FIG. 9 shows the structure of FIG. 7 following the formation of a drain and a source of a transistor device and forming of contacts to each of the source and the drain. FIG. 10 is a top view of the structure of FIG. 9. Following the patterning of masking material 218 to define openings for a drain and a source, surface 2051 of substrate 205 may be etched in the exposed areas to remove substrate material and to replace that substrate material with a material for each of a drain and a source (block 320, FIG. 19). FIG. 9 shows drain 250 and source 255 formed in substrate 205. Representatively, substrate 205 may be etched in device area 201 (through openings 219A and 219B in mask material 218) to remove substrate material. The removed substrate material may be replaced with a material for a source and a drain. Representatively, a material for drain 250 and source 255 is similar and is selected for the transistor device. In one embodiment, drain 250 and source 255 are formed by an epitaxial growth process. Suitable materials include silicon, germanium, silicon germanium or a group III-V compound material. An example of a group III-V compound material, particularly for an n-type transistor device is indium gallium arsenide (InGaAs). Germanium and silicon germanium are examples of material for a source and a drain for a p-type transistor device. Drain 250 and source 255 may be appropriately doped n- or p-type at the time of deposition of a semiconductor material or afterwards.

Following the formation of drain 250 and source 255 in device area 201 of substrate 205, contacts are formed to each of the source and drain (block 325, FIG. 19). FIG. 9 shows contact 260 to drain 250 and contact 265 to source 255. In one embodiment, the contacts are electrically conductive materials such as a metal material. An example includes tungsten. The contact material is deposited on openings 219A and 219B. As illustrated, the contacts are deposited to a height representatively of masking material 218 selected for a height of the contact.

Figure 11:
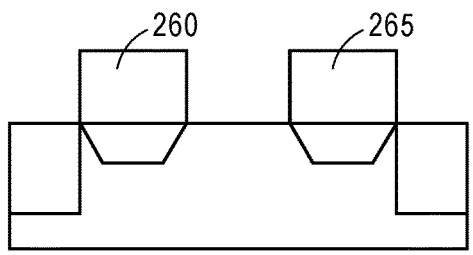
FIG. 11 shows the structure of FIG. 19 following the removal of a masking material.
Figure 12:
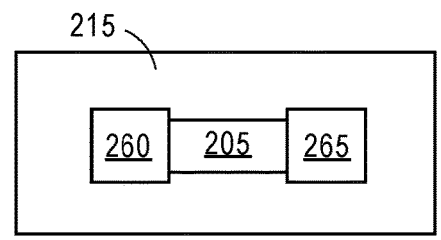
FIG. 12 shows the top view of the structure of FIG. 11.

FIG. 11 shows the structure of FIG. 9 following the removal of masking material 218 (block 330, FIG. 19). FIG. 12 shows the top view of the structure of FIG. 11. A masking material of, for example, a photoresist may be removed by an oxidation process.

Figure 13:
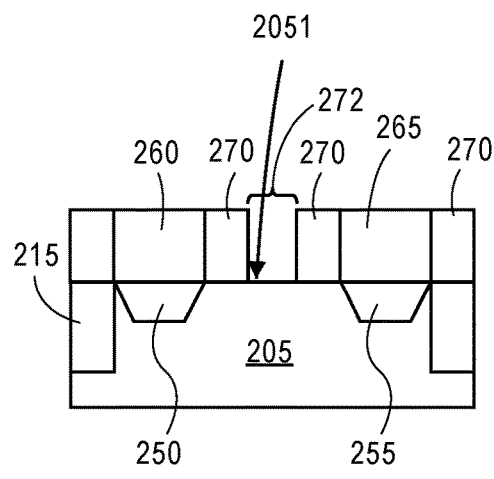
FIG. 13 shows the structure of FIG. 11 following the formation of spacers on each of the drain and source contacts.
Figure 14:
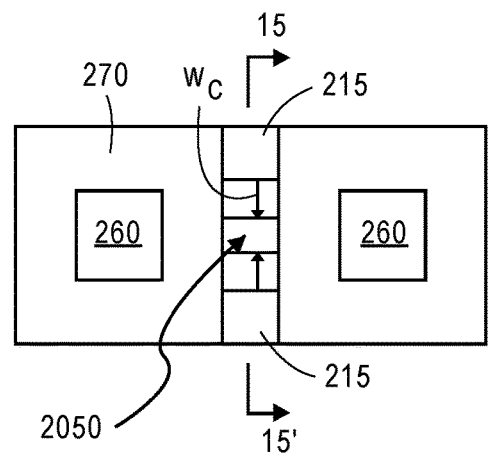
FIG. 14 is a top view of the structure of FIG. 13.
Figure 15:
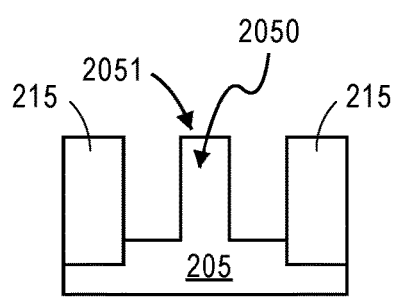
FIG. 15 shows the structure of FIG. 14 through line 15-15'.

FIG. 13 shows the structure of FIG. 11 following the formation of spacers on each of the drain and source contacts and the formation of a fin in a channel region. FIG. 14 is a top view of the structure of FIG. 13. FIG. 15 shows a view of the structure of FIG. 14 through line 15-15'. Spacer material 270 of, for example, a dielectric material such as silicon nitride or a high-k material is deposited and patterned around each of drain contact 260 and source contact 265 and patterned to have opening 272 in an area between the drain contact and the source contact (block 335, FIG. 19).

FIGS. 13-15 also show the structure after forming a body or fin in substrate 205 in a channel region of the device area (block 340, FIG. 19). In one embodiment, fin 2050 is formed by etching substrate 205. Representatively, a masking material of, for example, a photoresist is formed on substrate 205 in opening 272 and patterned to have a width, $W_c$, of a channel for a transistor device. The substrate is then etched using the mask and spacer material 270 to define fin 2050 in the structure. The etch removes material of substrate 205 so that fin 2050 has opposing sidewalls extending a distance below surface 2051 of the substrate.

In the embodiment described fin 2050 of material of substrate 205 will be used serve as a channel of a transistor device. In another embodiment, fin 2050 may be replaced with a different material or materials. Representatively, once fin 2050 is formed, a dielectric material such as silicon dioxide or a low-k dielectric material may be deposited around fin 2050 and then fin 2050 may be removed by, for example, a selective etch. Fin 2050 may then be replaced by a material or materials desired for a channel of the transistor device.

Figure 16:
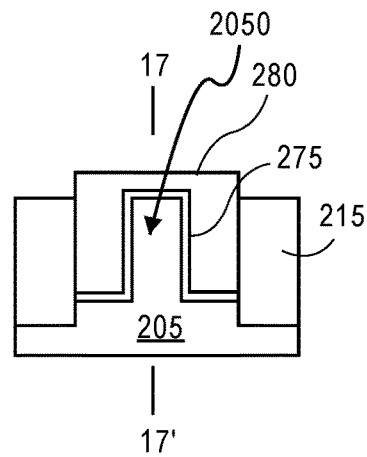
FIG. 16 shows the structure of FIG. 15 following the formation of a gate stack on the channel of transistor device.

FIG. 16 shows the structure of FIG. 15 following the formation of a gate stack on the channel of transistor device (block 345, FIG. 19). Referring to FIG. 16, following the formation of fin 2050, gate dielectric 275 of silicon dioxide or a high-k material is formed on fin 2050 by, for example, a deposition process. This is followed by the deposition of gate electrode 280 on fin 2050. In one embodiment, gate electrode 280 is an electrically conductive material such as a metal (e.g., titanium, tantalum), an alloy, a metal nitride (e.g., titanium nitride, tantalum nitride) or a silicide. As illustrated, spacers 270 and trench isolation 215 can serve as a pattern for the gate stack deposition. In one embodiment, the formation of the gate stack (gate dielectric 275 and gate electrode 280) may be done by masking the structure with a masking material patterned to have an opening for the gate stack on fin 2050 prior to the deposition of the gate stack materials.

Figure 17:
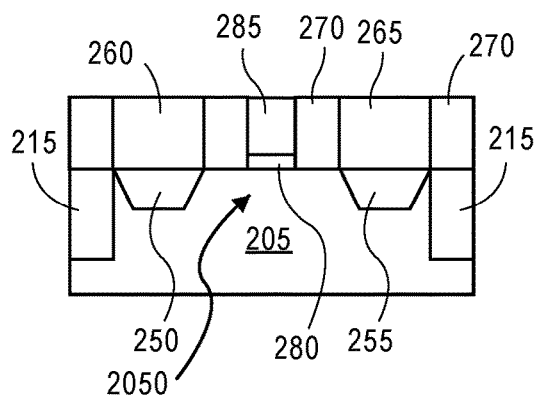
FIG. 17 shows the structure of FIG. 16 through lines 17-17' following the formation of a gate contact on the gate electrode.

FIG. 17 shows a structure of FIG. 16 through lines 17-17' following the formation of the contact to the gate electrode (block 350, FIG. 19). FIG. 18 shows a top view of the structure of FIG. 17. In one embodiment, after forming gate electrode 280, a dielectric material may be deposited on trench isolation 215 on opposite sides of gate electrode 280. FIG. 18 shows dielectric material 295 of, for example, silicon nitride patterned to define a contact area for a gate contact with such contact area being defined by dielectric material 295 and spacer material 270. Gate contact 285 may then be formed on gate electrode 280. In one embodiment, gate contact 285 is an electrically conductive material such as a metal such as tungsten. The gate contact may be formed by a deposition process using spacer layer 270 as a pattern.

The above embodiments describe a structure including a source and a drain formed in or on a bulk region of a substrate and used to create a self-aligned gate with an active channel structure patterned in the substrate as a fin. The transistor architecture described overcomes limits to the source/drain contact resistance arising in submicron FETs while allowing or use of low dimensional channel structures for improved gate control.

Figure 20:
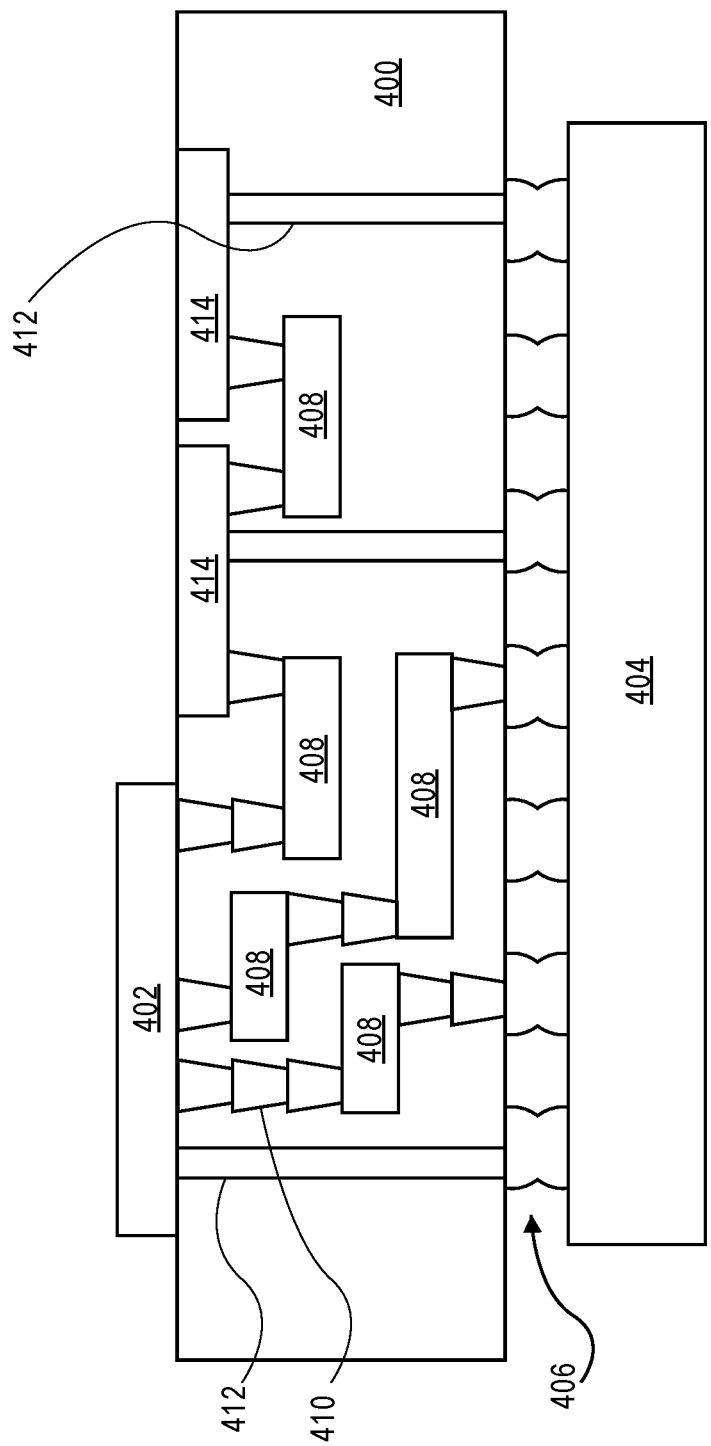
FIG. 20 is an interposer implementing one or more embodiments.

FIG. 20 illustrates interposer 400 that includes one or more embodiments. Interposer 400 is an intervening substrate used to bridge a first substrate 402 to second substrate 404. First substrate 402 may be, for instance, an integrated circuit die. Second substrate 404 may be, for instance, a memory module, a computer motherboard, or another integrated circuit die. Generally, the purpose of interposer 400 is to spread a connection to a wider pitch or to reroute a connection to a different connection. For example, interposer 400 may connect an integrated circuit die to ball grid array (BGA) 406 that can subsequently be connected to second substrate 404. In some embodiments, first and second substrates 402/404 are attached to opposing sides of interposer 400. In other embodiments, first and second substrates 402/404 are attached to the same side of interposer 400. In further embodiments, three or more substrates are interconnected by way of interposer 400.

Interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. Interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 400.

In accordance with embodiments, apparatuses or processes disclosed herein may be used in the fabrication of interposer 400.

Figure 21:
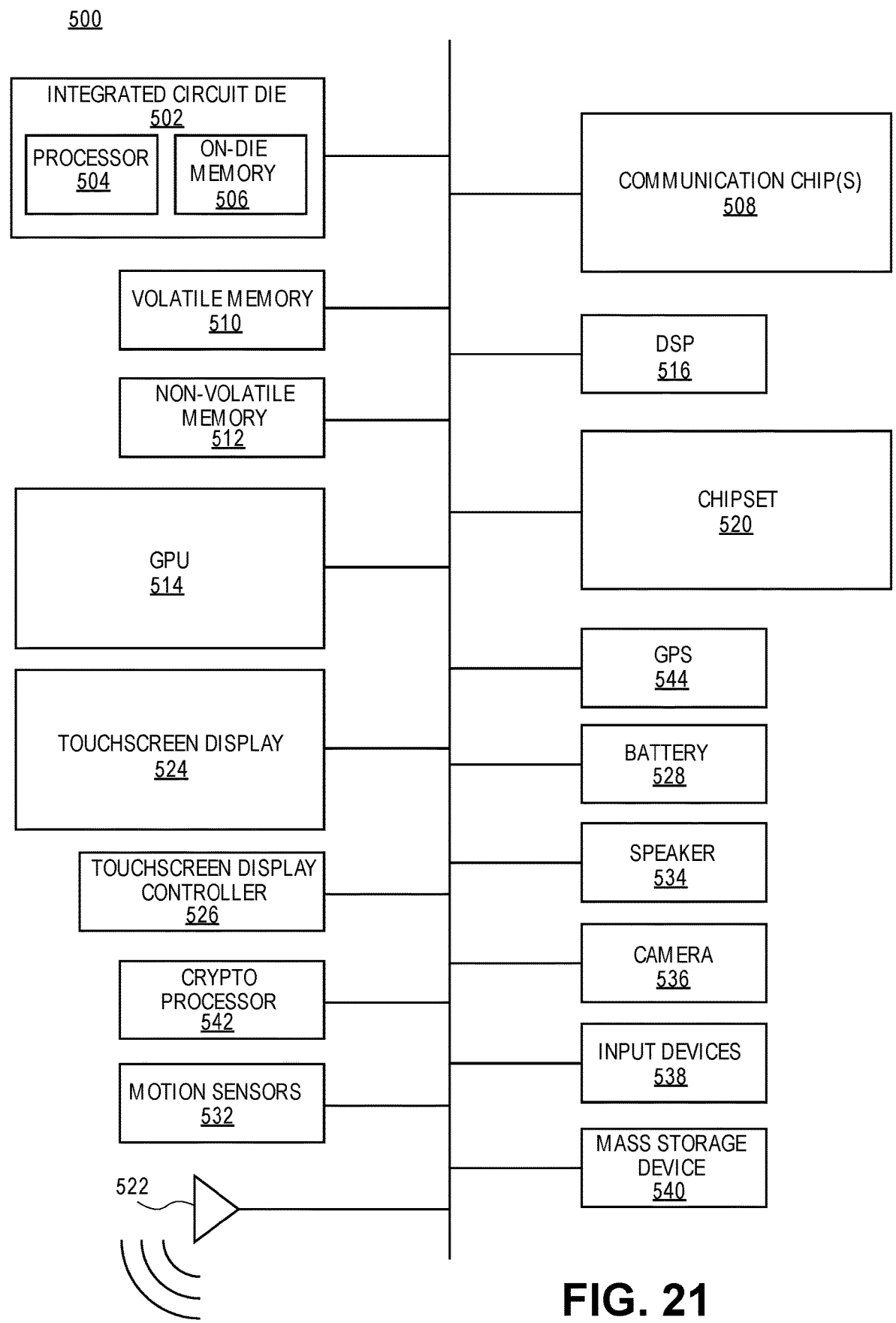
FIG. 21 illustrates an embodiment of a computing device.

FIG. 21 illustrates computing device 500 in accordance with one embodiment. Computing device 500 may include a number of components. In one embodiment, these components are attached to one or more motherboards. In an alternate embodiment, these components are fabricated onto a single system-on-a-chip (SoC) die rather than a motherboard. The components in computing device 500 include, but are not limited to, integrated circuit die 502 and at least one communication chip 508. In some implementations communication chip 508 is fabricated as part of integrated circuit die 502. Integrated circuit die 502 may include CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), graphics processing unit 514 (GPU), digital signal processor 516, crypto processor 542 (a specialized processor that executes cryptographic algorithms within hardware), chipset 520, antenna 522, display or a touchscreen display 524, touchscreen controller 526, battery 528 or other power source, a power amplifier (not shown), global positioning system (GPS) device 544, compass 530, motion coprocessor or sensors 532 (that may include an accelerometer, a gyroscope, and a compass), speaker 534, camera 536, user input devices 538 (such as a keyboard, mouse, stylus, and touchpad), and mass storage device 540 (such as hard disk drive, compact disk (CD), digital versatile disk (DVD), and so forth).

Communications chip 508 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 504 of computing device 500 includes one or more devices, such as transistors, that are formed in accordance with embodiments presented above. The term "processor" may refer to any device or portion of a device that processes electronic data from registers and/or memory to transform that electronic data into other electronic data that may be stored in registers and/or memory.

Communication chip 508 may also include one or more devices, such as transistors, that are formed in accordance with embodiments presented above.

In further embodiments, another component housed within computing device 500 may contain one or more devices, such as transistors, that are formed in accordance with implementations presented above.

In various embodiments, computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

EXAMPLES

Example 1 is a transistor including a source and a drain each formed in a substrate; a channel disposed in the substrate between the source and drain, wherein the channel includes opposing sidewalls with a distance between the opposing sidewalls defining a width dimension of the channel and wherein the opposing sidewalls extend a distance below a surface of the substrate; and a gate electrode on the channel.

In Example 2, the gate electrode of the transistor of Example 1 is disposed on the sidewalls of the channel and extends a distance below the surface of the substrate.

In Example 3, the width dimension of the channel of the transistor of Example 1 is less than a width dimension of the source and the drain.

In Example 4, the transistor of any of Examples 1-3 further includes a source contact on the source and a drain contact on the drain and a dielectric spacer disposed on a sidewall of each of the source contact and the drain contact wherein the gate electrode is disposed between the dielectric spacers.

In Example 5, the transistor of Example 4 further includes a gate contact disposed between the dielectric spacers.

In Example 6, the channel of the transistor of any of Examples 1-5 includes a material of the substrate.

Example 7 is a transistor including a source and a drain each formed in a surface of a substrate; a source contact on the source and a drain contact on the drain and a dielectric spacer disposed on a sidewall of each of the source contact and the drain contact; a channel disposed in the substrate between the source and drain, wherein the channel includes a body having opposing sidewalls separated by a length dimension of the distance between the dielectric spacer on the source contact and the dielectric spacer on the drain contact; and a gate electrode disposed on the opposing sidewalls of the channel at a level below.

In Example 8, the gate electrode of the transistor of Example 7 is disposed on the sidewalls of the channel at a level below a level of the source and the drain.

In Example 9, the width dimension of the channel of the transistor of Example 7 is less than a width dimension of the source and the drain.

In Example 10, the gate electrode of the transistor of any of Examples 7-9 is disposed between the dielectric spacer on the source contact and the dielectric spacer on the drain contact.

In Example 11, the transistor of Example 10 further includes a gate contact disposed between the dielectric spacer on the source contact and the dielectric spacer on the drain contact.

Example 12 is a method of forming a transistor including forming a source and a drain in an area of a substrate; forming a source contact on the source and a drain contact on the drain; after forming the source contact and the drain contact, forming a channel in the substrate in an area between the source and drain, the channel including a body having opposing sidewalls separated by a length dimension; and forming a gate contact on the channel.

In Example 13, prior to forming the gate contact, the method of Example 12 includes forming a gate electrode on the channel wherein the gate electrode is between the channel and the gate contact.

In Example 14, the gate electrode in the method of Example 13 is disposed on the opposing sidewalls of the channel.

In Example 15, forming the channel in the method of any of Examples 12-14 includes forming the channel to have a width dimension that is less than a width dimension of the source and the drain.

In Example 16, after forming the source contact and the drain contact, the method of any of Example 12-15 includes forming a dielectric spacer on a sidewall of each of the source contact and the drain contact and forming the channel includes forming the channel of a length between the dielectric spacer on the source contact and the dielectric spacer on the drain contact.

In Example 17, forming the gate contact in the method of Example 16 includes forming the gate contact between the dielectric spacer on the source contact and the dielectric spacer on the drain contact.

In Example 18, the dielectric spacer in the method of Example 16 surrounds each of the source contact and the drain contact.

In Example 19, the body of the channel in the method of any of Examples 12-18 includes a material of the substrate.

In Example 20, the body of the channel in the method of any of Example 12-19 includes a material different than a material of the substrate.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A transistor comprising:
an isolation structure in a substrate, the isolation structure having a top surface;
a source and a drain each formed in the substrate and within the isolation structure;
a channel disposed in the substrate between the source and drain, wherein the channel comprises opposing sidewalls with a distance between the opposing sidewalls defining a width dimension of the channel and wherein the opposing sidewalls extend a distance below a surface of the substrate, the channel having a top surface below the top surface of the isolation structure; and
a gate electrode on the channel, the gate electrode having an uppermost surface co-planar with the top surface of the isolation structure.

2. The transistor of claim 1, wherein the gate electrode is disposed on the opposing sidewalls of the channel and extends a distance below the surface of the substrate.

3. The transistor of claim 1, wherein the width dimension of the channel is less than a width dimension of the source and a width dimension of the drain.

4. The transistor of claim 1, further comprising a source contact on the source and a drain contact on the drain and a dielectric spacer disposed on a sidewall of each of the source contact and the drain contact wherein the gate electrode is disposed between the dielectric spacer.

5. The transistor of claim 4, further comprising a gate contact disposed between the dielectric spacer.

6. The transistor of claim 1, wherein the channel comprises a material of the substrate.

7. A transistor comprising:
an isolation structure in a substrate, the isolation structure having a top surface;
a source and a drain each formed in a surface of the substrate and within the isolation structure;
a source contact on the source and a drain contact on the drain and a dielectric spacer disposed on a sidewall of each of the source contact and the drain contact;
a channel disposed in the substrate between the source and drain, wherein the channel comprises a body having opposing sidewalls separated by a length dimension of a distance between the dielectric spacer on the source contact and the dielectric spacer on the drain contact, the channel having a top surface below the top surface of the isolation structure; and
a gate electrode disposed on the opposing sidewalls and the top surface of the channel, the gate electrode having an uppermost surface co-planar with the top surface of the isolation structure.

8. The transistor of claim 7, wherein the gate electrode is disposed on the opposing sidewalls of the channel at a level below a level of the source and the drain.

9. The transistor of claim 7, wherein a width dimension of the channel is less than a width dimension of the source and a width dimension of the drain.

10. The transistor of claim 7, wherein the gate electrode is disposed between the dielectric spacer on the source contact and the dielectric spacer on the drain contact.

11. The transistor of claim 10, further comprising a gate contact disposed between the dielectric spacer on the source contact and the dielectric spacer on the drain contact.

12. A method of forming a transistor comprising:
forming an isolation structure in a substrate, the isolation structure having a top surface;
forming a source and a drain in the substrate and within the isolation structure;
forming a source contact on the source and a drain contact on the drain;
after forming the source contact and the drain contact, forming a channel in the substrate in an area between the source and drain, the channel comprising a body having opposing sidewalls separated by a length dimension, the channel having a top surface below the top surface of the isolation structure; and
forming a gate electrode on the channel, the gate electrode having an uppermost surface co-planar with the top surface of the isolation structure.

13. The method of claim 12, wherein prior to forming the gate contact, the method comprises forming a gate electrode on the channel wherein the gate electrode is between the channel and the gate contact.

14. The method of claim 13, wherein the gate electrode is disposed on the opposing sidewalls of the channel.

15. The method of claim 12, wherein forming the channel comprises forming the channel to have a width dimension that is less than a width dimension of the source and a width dimension of the drain.

16. The method of claim 12, wherein after forming the source contact and the drain contact, the method comprises forming a dielectric spacer on a sidewall of each of the source contact and the drain contact and forming the channel comprises forming the channel of a length between the dielectric spacer on the source contact and the dielectric spacer on the drain contact.

17. The method of claim 16, wherein forming the gate contact comprises forming the gate contact between the dielectric spacer on the source contact and the dielectric spacer on the drain contact.

18. The method of claim 16, wherein the dielectric spacer surrounds each of the source contact and the drain contact.

19. The method of claim 12, wherein the body of the channel comprises a material of the substrate.

20. The method of claim 12, wherein the body of the channel comprises a material different than a material of the substrate.

21. A method of forming a transistor comprising:
forming a source and a drain in an area of a substrate;
forming a source contact on the source and a drain contact on the drain;
after forming the source contact and the drain contact, forming a dielectric spacer on a sidewall of each of the source contact and the drain contact;
forming a channel in the substrate in an area between the source and drain, the channel comprising a body having opposing sidewalls separated by a length dimension wherein and forming the channel comprises forming the channel of a length between the dielectric spacer on the source contact and the dielectric spacer on the drain contact; and
forming a gate contact on the channel.

* * * * *